United States Patent
Sun

(10) Patent No.: US 10,114,058 B2
(45) Date of Patent: Oct. 30, 2018

(54) SYSTEM AND METHOD FOR HIGH VOLTAGE LEAKAGE DETECTION

(71) Applicant: Ford Global Technologies, LLC, Dearborn, MI (US)

(72) Inventor: Xuemei Sun, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 395 days.

(21) Appl. No.: 14/502,508

(22) Filed: Sep. 30, 2014

(65) Prior Publication Data
US 2016/0091551 A1   Mar. 31, 2016

(51) Int. Cl.
*B60L 3/00* (2006.01)
*G01R 31/02* (2006.01)
(Continued)

(52) U.S. Cl.
CPC .......... *G01R 31/025* (2013.01); *B60L 3/0069* (2013.01); *B60L 11/1816* (2013.01);
(Continued)

(58) Field of Classification Search
CPC .... G01R 27/18; G01R 31/086; G01R 31/025; B60L 3/0069; B60L 3/0023
(Continued)

(56) References Cited

U.S. PATENT DOCUMENTS 5,382,946 A * 1/1995 Gale .................... G01R 31/006
324/510
7,924,019 B2 * 4/2011 Trenchs Magana ..... H02H 5/12
324/503
(Continued)

FOREIGN PATENT DOCUMENTS

DE   102009004853 B4 * 6/2015 .......... G01R 31/025
JP      2013195136 A  * 9/2013 ............ B60L 3/0069

OTHER PUBLICATIONS

Development of test instrumentation to measure the leakage resistance of a single fastener in trackwork; Medora, N.K.; Todd, P. Industrial and Commercial Power Systems Technical Conference, 1997. Conference Record, Papers Presented at the 1997 Annual Meeting., IEEE 1997; Year: 1997; pp. 247-257, DOI: 10.1109/ICPS.1997.596068.*

(Continued)

*Primary Examiner* — Cuong H Nguyen
(74) *Attorney, Agent, or Firm* — David Kelley; Brooks Kushman P.C.

(57) ABSTRACT

A vehicle includes a traction battery capable of being selectively coupled to a voltage bus. An inverter selectively couples the voltage bus to an electric machine. A leakage detection circuit including a switching element is connected between the voltage bus and a vehicle chassis. When the traction battery is coupled to the voltage bus and the switching element of the leakage detection circuit is closed, a leakage path in the electric machine may be checked by controlling the inverter to couple terminals of the electric machine to a common conductor of the voltage bus. A leakage path is detected when a leakage resistance associated with the leakage path is less than a predetermined resistance. The leakage resistance is ascertained by measuring a voltage within the leakage detection circuit. A location of the leakage path may be determined based on which components are coupled to the voltage bus.

20 Claims, 5 Drawing Sheets

(51) Int. Cl.
 *G01R 31/00* (2006.01)
 *B60L 11/18* (2006.01)
(52) U.S. Cl.
 CPC ...... *G01R 31/006* (2013.01); *B60L 2240/429* (2013.01); *B60L 2240/545* (2013.01); *B60L 2240/547* (2013.01); *B60L 2240/549* (2013.01); *Y02T 10/642* (2013.01); *Y02T 10/7005* (2013.01); *Y02T 10/7072* (2013.01); *Y02T 90/14* (2013.01)
(58) Field of Classification Search
 USPC ......... 701/34.2, 33.7, 22; 324/509–510, 522, 324/525; 320/500, 165; 361/42; 702/58; 325/510
 See application file for complete search history.

(56) References Cited

U.S. PATENT DOCUMENTS

| | | | | |
|---|---|---|---|---|
| 8,829,915 | B2* | 9/2014 | Nishida | B60L 3/0069 324/509 |
| 9,802,495 | B2* | 10/2017 | Sun | B60L 11/1809 |
| 2004/0004481 | A1 | 1/2004 | Jin | |
| 2005/0146335 | A1* | 7/2005 | Wild | G01R 31/025 324/510 |
| 2007/0285057 | A1* | 12/2007 | Yano | B60L 3/0046 320/116 |
| 2010/0033140 | A1* | 2/2010 | Otake | B60L 3/04 320/165 |
| 2011/0006777 | A1 | 1/2011 | Park et al. | |
| 2013/0106437 | A1* | 5/2013 | Herraiz | G01R 31/11 324/615 |
| 2013/0245869 | A1* | 9/2013 | Nishida | B60L 3/0069 701/22 |
| 2014/0046534 | A1* | 2/2014 | Lazar, II | B60L 3/04 701/33.9 |
| 2014/0132278 | A1 | 5/2014 | Tang et al. | |
| 2016/0052409 | A1* | 2/2016 | Sun | B60L 11/1809 320/109 |
| 2016/0096438 | A1* | 4/2016 | Grimes | B60L 11/1816 320/109 |
| 2018/0009322 | A1* | 1/2018 | Sun | B60L 11/1809 |

OTHER PUBLICATIONS

The leakage resistance to ground of a NIST Programmable Josephson Voltage Standard; Solve, S.; Chayramy, R.; Rufenacht, A.; Burroughs, C.J.; Benz, S.P.; Precision Electromagnetic Measurements (CPEM 2014), 2014 Conference on; Year: 2014 pp. 462-463, DOI: 10.1109/CPEM.2014.6898459.*

Power distribution network design optimization with on-die voltage-dependent leakage path; Xiang Zhang; Yang Liu; Coutts, R.; Chung-Kuan Cheng; Electrical Performance of Electronic Packaging and Systems (EPEPS), 2013 IEEE 22nd Conference on Year: 2013; pp. 87-90, DOI: 10.1109/EPEPS.2013.6703473.*

Smart charger for electric vehicles on single-phase three-wire distribution feeders with constant dc-capacitor voltage control under multiple household customers; Fuka Ikeda; Toshihiko Tanaka; Hiroaki Yamada; Masayuki Okamoto; Electrical Machines and Systems (ICEMS), 2015 18th International Conference on; Year: 2015 pp. 492-497, DOI: 10.1109/.*

A 55-kW Three-Phase Inverter Based on Hybrid-Switch Soft-Switching Modules for High-Temperature Hybrid Electric Vehicle Drive Application ; Pengwei Sun; Jih-Sheng Lai; Chuang Liu; Wensong Yu; IEEE Transactions on Industry Applications Year: 2012, vol. 48, Issue: 3; pp. 962-969, DOI: 10.1109/TIA.2012. 2191169.*

A new Hybrid Cascaded H-Bridge Multilevel inverter—Performance analysis; N. Sujitha.; K. Ramani.; Advances in Engineering, Science and Management (ICAESM), 2012 International Conference on; Year: 2012; pp. 46-50.*

Aligned three-phase inductive coupled structure applied to contactless charging paddle system for electric vehicles; Jia-You Lee; Hung-Yu Shen; Shang-Ti Liu; Industrial Electronics (ISIE), 2013 IEEE International Symposium on; Year: 2013 pp. 1-6, DOI: 10.1109/ISIE.2013.6563621.*

* cited by examiner

SYSTEM AND METHOD FOR HIGH VOLTAGE LEAKAGE DETECTION

TECHNICAL FIELD

This application generally relates to leakage current detection for vehicles including a high-voltage bus.

BACKGROUND

A hybrid-electric or all-electric vehicle includes a traction battery constructed of multiple battery cells in series and/or parallel. The traction battery provides power for vehicle propulsion and accessory features. The traction battery typically operates at high voltages. Under normal conditions, a high-voltage system is designed to have a high resistance between the traction battery terminals and ground. However, it is possible during operation that the leakage resistance decreases for a number of reasons. Many high-voltage systems include circuitry to monitor and detect the presence of an abnormal leakage current within the traction battery.

SUMMARY

A vehicle includes a voltage bus, an inverter configured to selectively couple the voltage bus to an electric machine, and a switching element arranged within a circuit including the voltage bus and a chassis of the vehicle. The vehicle further includes at least one controller programmed to, while the switching element is closed, operate the inverter to couple terminals of the electric machine to a common conductor of the voltage bus to detect a leakage path to the chassis. The circuit may include a voltage measurement resistor electrically connected to the chassis of the vehicle and a current limiting resistor electrically connected to the voltage bus, and wherein the switching element selectively couples the voltage measurement resistor and the current limiting resistor. The at least one controller may be further programmed to operate the switching element to couple the voltage measurement resistor and the current limiting resistor, and measure a voltage across the voltage measurement resistor to estimate a leakage resistance to the chassis. The leakage path may be detected when a leakage resistance associated with the leakage path is less than a predetermined resistance, and wherein the leakage resistance is based on a voltage across the voltage measurement resistor and a voltage of the voltage bus. The common conductor of the voltage bus may be a positive side of the voltage bus. The common conductor of the voltage bus may be a negative side of the voltage bus. The terminals of the electric machine may be coupled to the common conductor of the voltage bus for a predetermined amount of time. The at least one controller may be further programmed to output a diagnostic indicator when a leakage resistance associated with the leakage path to the chassis is less than a predetermined resistance. The leakage path to the chassis may be detected when a leakage resistance associated with the leakage path is less than a predetermined resistance.

A method, executed as a sequence of instructions in a controller, includes decoupling a traction battery from a voltage bus and detecting a first leakage resistance, coupling the traction battery to the voltage bus and detecting a second leakage resistance, and coupling terminals of an electric machine to a common conductor of the voltage bus that is coupled to the traction battery and detecting a third leakage resistance. The method may further include outputting a traction battery isolation diagnostic when the first leakage resistance is less than a predetermined resistance. The method may further include outputting a voltage bus isolation diagnostic when the second leakage resistance is less than a predetermined resistance and the first leakage resistance is greater than the predetermined resistance. The method may further include outputting an electric machine isolation diagnostic when the third leakage resistance is less than a predetermined resistance and the first leakage resistance and the second leakage resistance are greater than the predetermined resistance. Detecting the first leakage resistance, the second leakage resistance, and the third leakage resistance may further include closing, by the controller, a switching element arranged within a circuit including the voltage bus and a vehicle chassis and measuring a voltage within the circuit.

A method, executed as a sequence of instructions in a controller, includes closing a switching element to connect a leakage detection path between a voltage bus and a vehicle chassis, coupling terminals of an electric machine to a common conductor of the voltage bus when a traction battery is coupled to the voltage bus, and measuring a voltage within the leakage detection path to estimate a leakage resistance. The leakage detection path may be connected to a conductor of the voltage bus other than the common conductor. The method may further include outputting an electric machine isolation diagnostic when the leakage resistance is less than a predetermined resistance. The voltage may be measured across a resistor within the leakage detection path. The method may further include coupling the terminals of the electric machine to the common conductor of the voltage bus for a predetermined period of time. The predetermined period of time may be a predetermined number of leakage detection cycles.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
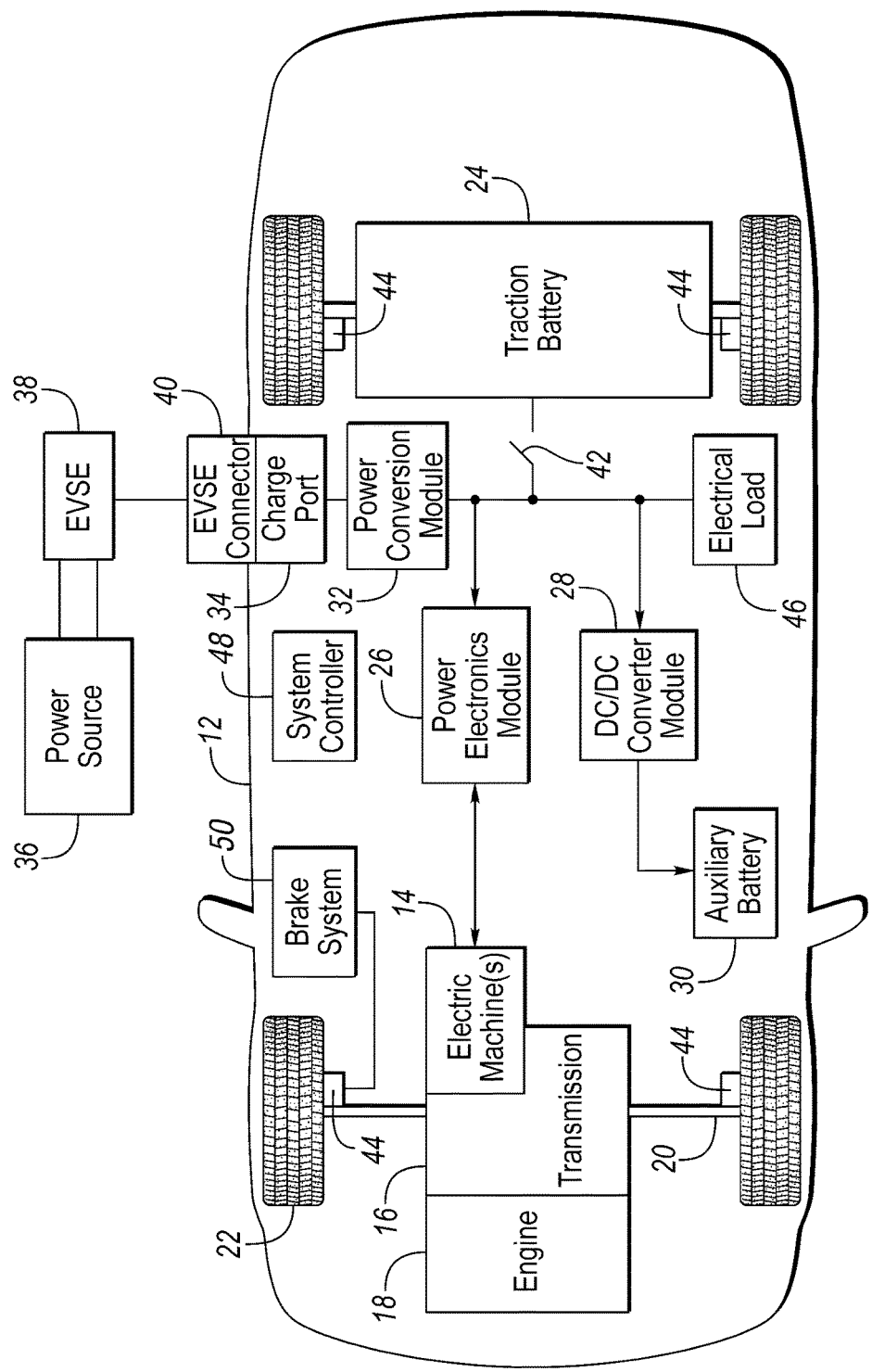
FIG. 1 is a diagram of a hybrid vehicle illustrating typical drivetrain and energy storage components.

FIG. 1 depicts a typical plug-in hybrid-electric vehicle (PHEV). A typical plug-in hybrid-electric vehicle 12 may comprise one or more electric machines 14 mechanically connected to a hybrid transmission 16. The electric machines 14 may be capable of operating as a motor or a generator. In addition, the hybrid transmission 16 is mechanically connected to an engine 18. The hybrid transmission 16 is also mechanically connected to a drive shaft 20 that is mechanically connected to the wheels 22. The electric machines 14 can provide propulsion and deceleration capability when the engine 18 is turned on or off. The electric machines 14 also act as generators and can provide fuel economy benefits by recovering energy that would normally be lost as heat in the friction braking system. The electric machines 14 may also reduce vehicle emissions by allowing the engine 18 to operate at more efficient speeds and allowing the hybrid-electric vehicle 12 to be operated in electric mode with the engine 18 off under certain conditions.

A traction battery or battery pack 24 stores energy that can be used by the electric machines 14. The vehicle battery pack 24 typically provides a high voltage DC output. The traction battery 24 is electrically connected to one or more power electronics modules 26. One or more contactors 42 may isolate the traction battery 24 from other components when opened and connect the traction battery 24 to other components when closed. The power electronics module 26 is also electrically connected to the electric machines 14 and provides the ability to bi-directionally transfer energy between the traction battery 24 and the electric machines 14. For example, a typical traction battery 24 may provide a DC voltage while the electric machines 14 may operate using a three-phase AC current. The power electronics module 26 may convert the DC voltage to a three-phase AC current for use by the electric machines 14. In a regenerative mode, the power electronics module 26 may convert the three-phase AC current from the electric machines 14 acting as generators to the DC voltage compatible with the traction battery 24. The description herein is equally applicable to a pure electric vehicle. For a pure electric vehicle, the hybrid transmission 16 may be a gear box connected to the electric machine 14 and the engine 18 may not be present.

In addition to providing energy for propulsion, the traction battery 24 may provide energy for other vehicle electrical systems. A typical system may include a DC/DC converter module 28 that converts the high voltage DC output of the traction battery 24 to a low voltage DC supply that is compatible with other vehicle loads. Other high-voltage loads 46, such as compressors and electric heaters, may be connected directly to the high-voltage without the use of a DC/DC converter module 28. The low-voltage systems may be electrically connected to an auxiliary battery 30 (e.g., 12V battery).

The vehicle 12 may be an electric vehicle or a plug-in hybrid vehicle in which the traction battery 24 may be recharged by an external power source 36. The external power source 36 may be a connection to an electrical outlet that receives utility power. The external power source 36 may be electrically connected to electric vehicle supply equipment (EVSE) 38. The EVSE 38 may provide circuitry and controls to regulate and manage the transfer of energy between the power source 36 and the vehicle 12. The external power source 36 may provide DC or AC electric power to the EVSE 38. The EVSE 38 may have a charge connector 40 for plugging into a charge port 34 of the vehicle 12. The charge port 34 may be any type of port configured to transfer power from the EVSE 38 to the vehicle 12. The charge port 34 may be electrically connected to a charger or on-board power conversion module 32. The power conversion module 32 may condition the power supplied from the EVSE 38 to provide the proper voltage and current levels to the traction battery 24. The power conversion module 32 may interface with the EVSE 38 to coordinate the delivery of power to the vehicle 12. The EVSE connector 40 may have pins that mate with corresponding recesses of the charge port 34. Alternatively, various components described as being electrically connected may transfer power using a wireless inductive coupling.

One or more wheel brakes 44 may be provided for decelerating the vehicle 12 and preventing motion of the vehicle 12. The wheel brakes 44 may be hydraulically actuated, electrically actuated, or some combination thereof. The wheel brakes 44 may be a part of a brake system 50. The brake system 50 may include other components to operate the wheel brakes 44. For simplicity, the figure depicts a single connection between the brake system 50 and one of the wheel brakes 44. A connection between the brake system 50 and the other wheel brakes 44 is implied. The brake system 50 may include a controller to monitor and coordinate the brake system 50. The brake system 50 may monitor the brake components and control the wheel brakes 44 for vehicle deceleration. The brake system 50 may respond to driver commands and may also operate autonomously to implement features such as stability control. The controller of the brake system 50 may implement a method of applying a requested brake force when requested by another controller or sub-function.

One or more electrical loads 46 may be connected to the high-voltage bus. The electrical loads 46 may have an associated controller that operates and controls the electrical loads 46 when appropriate. Examples of electrical loads 46 may be a heating module or an air-conditioning module.

The various components discussed may have one or more associated controllers to control and monitor the operation of the components. The controllers may communicate via a serial bus (e.g., Controller Area Network (CAN)) or via discrete conductors. A system controller 48 may be present to coordinate the operation of the various components.

Figure 2:
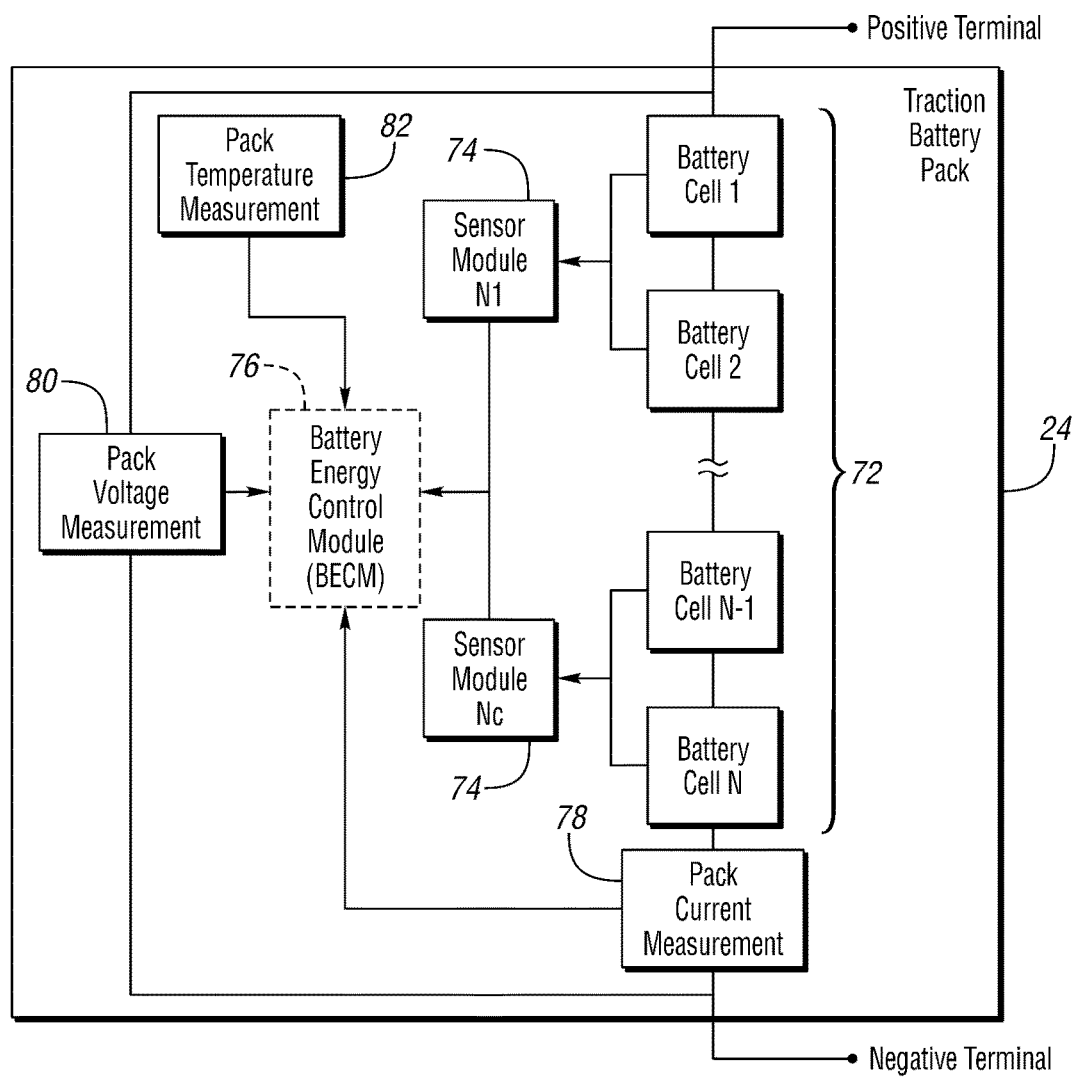
FIG. 2 is a diagram of a possible battery pack arrangement comprised of multiple cells, and monitored and controlled by a Battery Energy Control Module.

The traction battery 24 may be constructed from a variety of chemical formulations. Typical battery pack chemistries may be lead acid, nickel-metal hydride (NIMH) or Lithium-Ion. FIG. 2 shows a typical traction battery pack 24 in a series configuration of N battery cells 72. Other battery packs 24, however, may be composed of any number of individual battery cells connected in series or parallel or some combination thereof. A battery management system may have a one or more controllers, such as a Battery Energy Control Module (BECM) 76 that monitors and controls the performance of the traction battery 24. The BECM 76 may include sensors and circuitry to monitor several battery pack level characteristics such as pack current 78, pack voltage 80 and pack temperature 82. The BECM 76 may have non-volatile memory such that data may be retained when the BECM 76 is in an off condition. Retained data may be available upon the next key cycle.

In addition to the pack level characteristics, there may be battery cell 72 level characteristics that are measured and monitored. For example, the terminal voltage, current, and temperature of each cell 72 may be measured. The battery management system may use a sensor module 74 to measure the battery cell 72 characteristics. Depending on the capabilities, the sensor module 74 may include sensors and circuitry to measure the characteristics of one or multiple of the battery cells 72. The battery management system may utilize up to $N_c$ sensor modules or Battery Monitor Integrated Circuits (BMIC) 74 to measure the characteristics of all the battery cells 72. Each sensor module 74 may transfer the measurements to the BECM 76 for further processing and coordination. The sensor module 74 may transfer signals in analog or digital form to the BECM 76. In some embodiments, the sensor module 74 functionality may be incorporated internally to the BECM 76. That is, the sensor module 74 hardware may be integrated as part of the circuitry in the BECM 76 and the BECM 76 may handle the processing of raw signals. The BECM 76 may also include circuitry to interface with the one or more contactors 42 to open and close the contactors 42.

Figure 3:
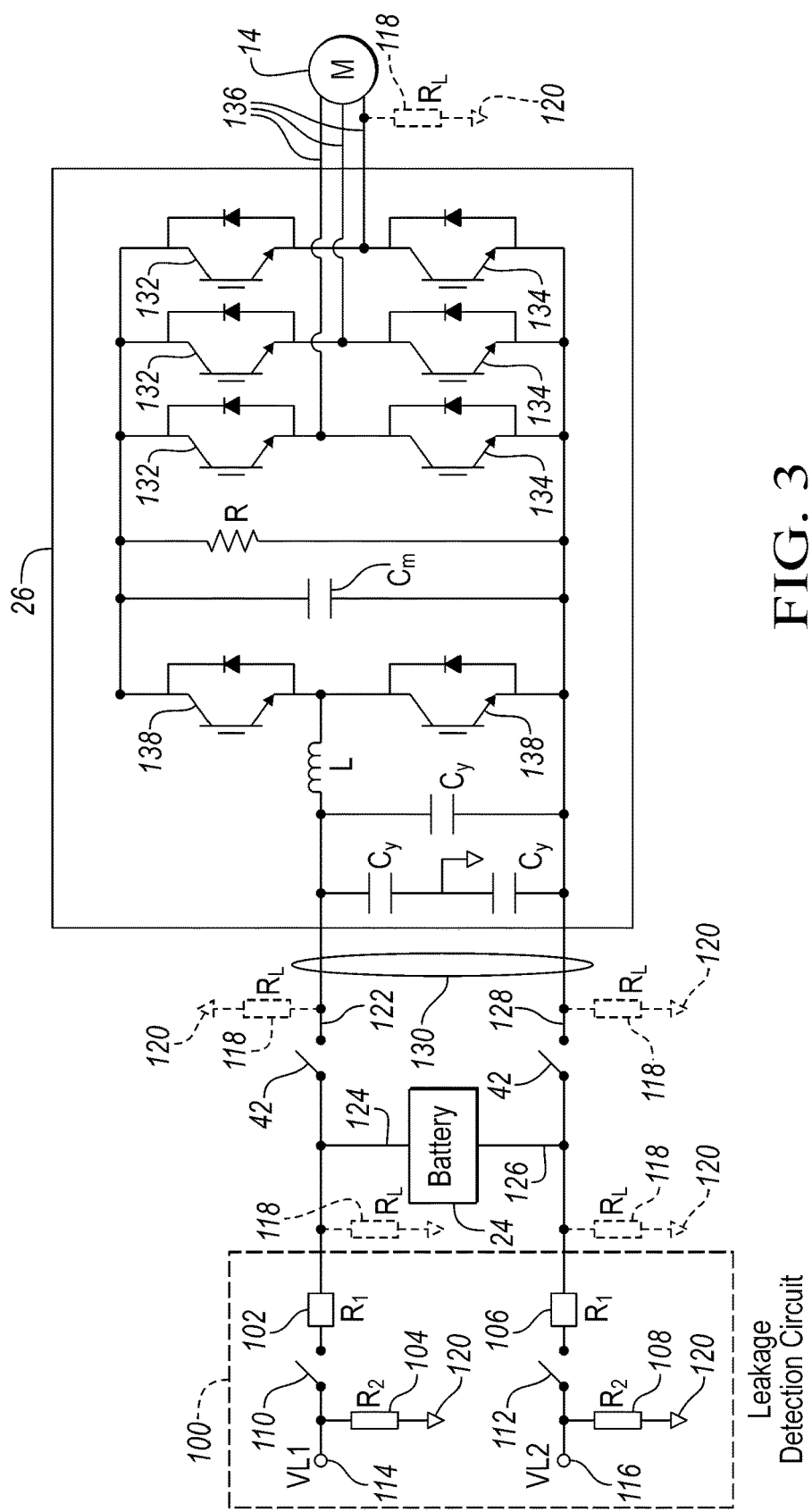
FIG. 3 is a diagram of a possible system for detecting a leakage resistance.

FIG. 3 depicts a diagram of a possible system for detecting electrical isolation in a vehicle 12. The traction battery 24 may have a positive terminal 124 and a negative terminal 126. The traction battery terminals 124, 126 may be coupled to contactors 42 that selectively connect the traction battery terminals 124, 126 to conductors 122, 128 that are part of a high-voltage bus 130. The high-voltage bus 130 may route the high-voltage from the traction battery 24 to other components in the vehicle (e.g., Power Electronics Module 26). The battery management system may maintain electrical isolation between the traction battery terminals 124, 126 a chassis ground 120. The chassis ground 120 may be a common reference point to which electrical devices are electrically connected to (e.g., a chassis of the vehicle 12). The electrical isolation may be described as a leakage resistance 118 between the chassis ground 120 and a terminal (124, 126) of the traction battery 24. Under normal conditions, the leakage resistance 118 will have a relatively large value and little or no leakage current will flow through the chassis ground 120. Note that the leakage resistance 118 may occur at various locations within the high-voltage system. The leakage resistances 118 shown are illustrative of various locations at which the leakage current may flow. Various government regulations and industry standards may specify a minimum value for electrical isolation in a high-voltage system. For example, an electrical isolation of no less than 500 ohms/Volt between the battery terminals (124, 126) and the chassis ground 120 may be specified.

The vehicle 12 may include leakage detection circuitry 100 for detecting the presence of electrical isolation issues. Leakage detection circuitry may be connected to each terminal (124, 126) of the traction battery 24. In addition, when the contactors 42 are closed, the leakage detection circuitry is connected to the high-voltage bus 130. The leakage detection circuitry 100 may include one or more voltage measurement resistors (104, 108) that are electrically connected to the chassis ground 120. One or more current limiting resistors (102, 106) may be electrically connected to the high-voltage bus 130 or terminals 124, 126 of the traction battery 24. One or more switching elements 110, 112 may selectively electrically connect the associated current limiting resistor 102, 106 and the associated voltage measurement resistor 104, 108. The switching elements 110, 112 may be a solid-state device or a relay. The leakage detection circuit 100 depicted may be described as a voltage divider network. Other configurations of the leakage detection circuit 100 are possible.

As an example, the current limiting resistors 102, 106 may have a value of 513K ohms and the voltage measurement resistors 104, 108 may have a value of 4.64K ohms. The values may be selected to ensure that a small current flows during the leakage test. The values may also be selected to provide a sufficient range of voltages across the voltage measurement resistors 104, 108 over the expected leakage currents.

The resistance values of the voltage measurement resistors (104, 108) and the current limiting resistors (102, 106) may be chosen such that the voltage across the voltage measurement resistors (104, 108) may be sampled by a controller 76. The controller 76 may include electrical isolation, filtering, and scaling circuitry to process the voltage prior to converting the signal using an A/D converter. The leakage detection circuitry 100 may be electrically coupled to each conductor 122, 128 of the high-voltage bus. In some configurations, the voltage measurement resistors 104, 108 may have the same value (e.g., $R_2$) and the current limiting resistors 102, 106 may have the same value (e.g., $R_1$).

The electrical isolation may be represented as a resistance between a conductor 122, 128 of the high-voltage bus 130 and the chassis ground 120. The leakage detection circuit 100 provides a mechanism to estimate the leakage resistance 118 between the conductors 122, 128 and the chassis ground 120 to detect a leakage path. When the switching element 110, 112 electrically connects the resistors, a leakage path may be formed that includes the leakage resistance 118. Since the traction battery 24 is not referenced to chassis ground 120, any current flow passes through the leakage resistance 118 in order to complete the circuit. Assuming an infinite leakage resistance 118, no current would flow through the leakage path and the voltage across the voltage measurement resistor 104, 108 would indicate zero volts. At the other extreme, assuming a leakage resistance 118 of zero, the voltage across the voltage measurement resistor 104, 108 would indicate a voltage that is the battery voltage reduced by the operation of the voltage divider.

Figure 4A:
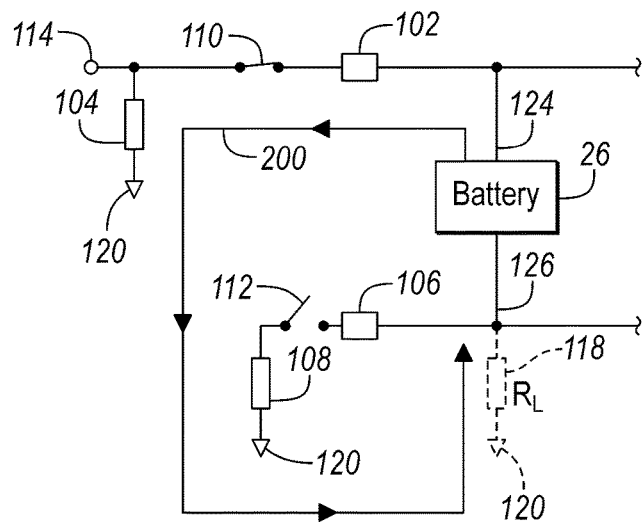
FIGS. 4A and 4B are diagrams illustrating potential leakage paths.
Figure 4B:
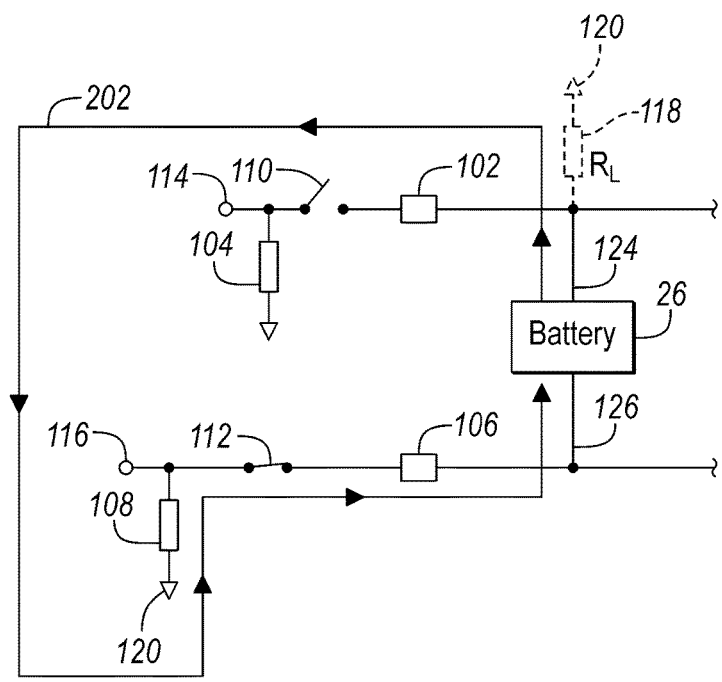

The leakage resistance 118 may be estimated by switching one of the switching elements 110, 112 at a given time and measuring the voltage across the voltage measuring resistor 104, 108. FIGS. 4A and 4B illustrate the completed leakage circuits for detecting a leakage condition. The leakage resistance 118 on the negative conductor 128 of the high-voltage bus 130 may be determined when the switch 110 associated with the positive conductor 122 is closed (see FIG. 4A). In this case, current 200 flows through the current limiting resistor 102 and the voltage measurement resistor 104 associated with the positive terminal 124. The current 200 then flows through the chassis ground 120 and through the leakage resistance 118 to the negative terminal 126 to complete the circuit.

The leakage resistance 118 on the positive conductor 122 of the high-voltage bus 130 may be determined when the switch 112 associated with the negative conductor 128 is closed (see FIG. 4B). In this case, current 202 flows from the positive terminal 124 through the leakage resistance 118 to the chassis ground 120. The leakage current then flows from the chassis ground 120 through the voltage measurement resistor 108 and the current limiting resistor 106 associated with the negative terminal 126 to complete the circuit. The leakage resistance 118 affects the amount of current that flows through the circuit. The current affects the voltage measured across the voltage measurement resistors 104, 108.

The switching elements 110, 112 of the leakage detection circuit 100 may be periodically switched and monitored to detect a change in the electrical isolation of the traction battery 24 and the high-voltage bus 130.

A leakage condition may be detected when a leakage resistance value is less than a predetermined resistance. When one of the switches 110, 112 is closed, the battery or bus voltage is equal to the voltage drop across all of the resistances.

$$V_{bus} = I(R_1 + R_2 + R_{Leakage})$$

The current, I, flowing through the circuit may be calculated by measuring the voltage across the voltage measurement resistor 104, 108 associated with the closed switching element 110, 112. The current, I, is equal to the voltage across the voltage measurement resistor 104, 108 divided by the voltage measurement resistor 104, 108 value (e.g., I=VL1/$R_2$).

Solving for the leakage resistance, $R_{Leakage}$, results in the following expression:

$$R_{Leakage} = (V_{bus}/I) - (R_1 + R_2)$$

The $R_{Leakage}$ value may be analyzed to determine if the proper electrical isolation is present. For example, a leakage resistance 118 of less than 39K ohms may indicate a severe leakage condition. When the leakage resistance 118 is below this value, a diagnostic indicator may be output to alert the operator of the condition. In addition, the battery management system may force the main contactors 42 to open to disconnect the traction battery 24 from the high-voltage bus 130. A leakage resistance 118 that is between 39K ohms and 195K ohms may indicate a mild leakage condition. A diagnostic indicator may be output to alert the operator of the condition.

In addition to the presence of an excessive leakage current, the actual location of the leakage current may be determined. The location of the leakage current may provide valuable information for service personnel. The component or sub-system in which the leakage current is present may be identified as part of the diagnostic indicator. This identification may indicate the component that should be replaced. Such knowledge may help reduce service costs and minimize repair times.

A first leakage detection cycle may be initiated when the main contactors 42 are open. Under this condition, any leakage condition may be identified as being associated with the traction battery 24. The leakage condition may be detected as described earlier.

If no leakage condition is detected within the traction battery 24, a second leakage detection cycle may be initiated when the main contactors 42 are closed. All other components connected to the high-voltage bus 130 should be disabled. Under this condition, any leakage condition may be identified as being associated with the high-voltage bus 130. Additional testing may be done to identify the exact location. For example, the leakage condition may be in a component that is connected to the high-voltage bus 130.

A third leakage detection cycle may be initiated when the main contactors 42 are closed and no leakage is detected on the high-voltage bus 130.

The power electronics module 26 may also be referred to as an Inverter System Control (ISC) module. The power electronics module 26 may include switching devices 132, 134 configured to electrically couple each terminal 136 of the electric machine 14 to a conductor 122, 128 of the high-voltage bus 130. A controller may operate the switching devices 132, 134 to control the operation of the electric machine 14. The power electronics module 26 may also include components to adjust the voltage from the high-voltage bus 130. For example, components that implement a boost converter may be provided to increase the DC voltage from the high-voltage bus 130.

The electric machine 14 may be a three-phase electric machine. The power electronics module 26 may provide three-phase currents and voltages to the electric machine 14. It is possible that a current leakage condition lies in one of the terminals 136 or wires of the electric machine 14. The current leakage condition may also be located in the power electronics module 26. A method of testing for a current leakage within the electric machine 14 and power electronics module 26 may help to determine the location of the leakage current.

The leakage resistance 118 due to the electric machine 14 may be checked by electrically coupling each terminal 136 of the electric machine 14 to a common terminal (124 or 126) of the traction battery 24. This may be achieved by operating the switching devices 132, 134 within the power electronics module 26. Any switching devices 138 associated with the boost converter may be disabled during the leakage check. For example, each of the switching devices 132 that are coupled to the positive conductor 122 of the high-voltage bus 130 may be activated to provide an electrical connection between each of the electric machine terminals 136 and the positive conductor of the high-voltage bus 130. Under normal conditions, no current flows in the electric machine 14 since all of the terminals 136 are connected to the same voltage.

A leakage condition may now be checked by operating the leakage detection circuit 100 as described previously. If an excessive leakage current is detected, the source of the issue may be traced to the electric machine 14. The switching element 110, 112 of the leakage detection circuit 100 that is activated may depend on the high-voltage bus conductor 122, 128 that is being tested. The switching element 110, 112 selected may be the one that couples the leakage detection circuit 100 to the conductor that is other than the conductor being tested.

Figure 5:
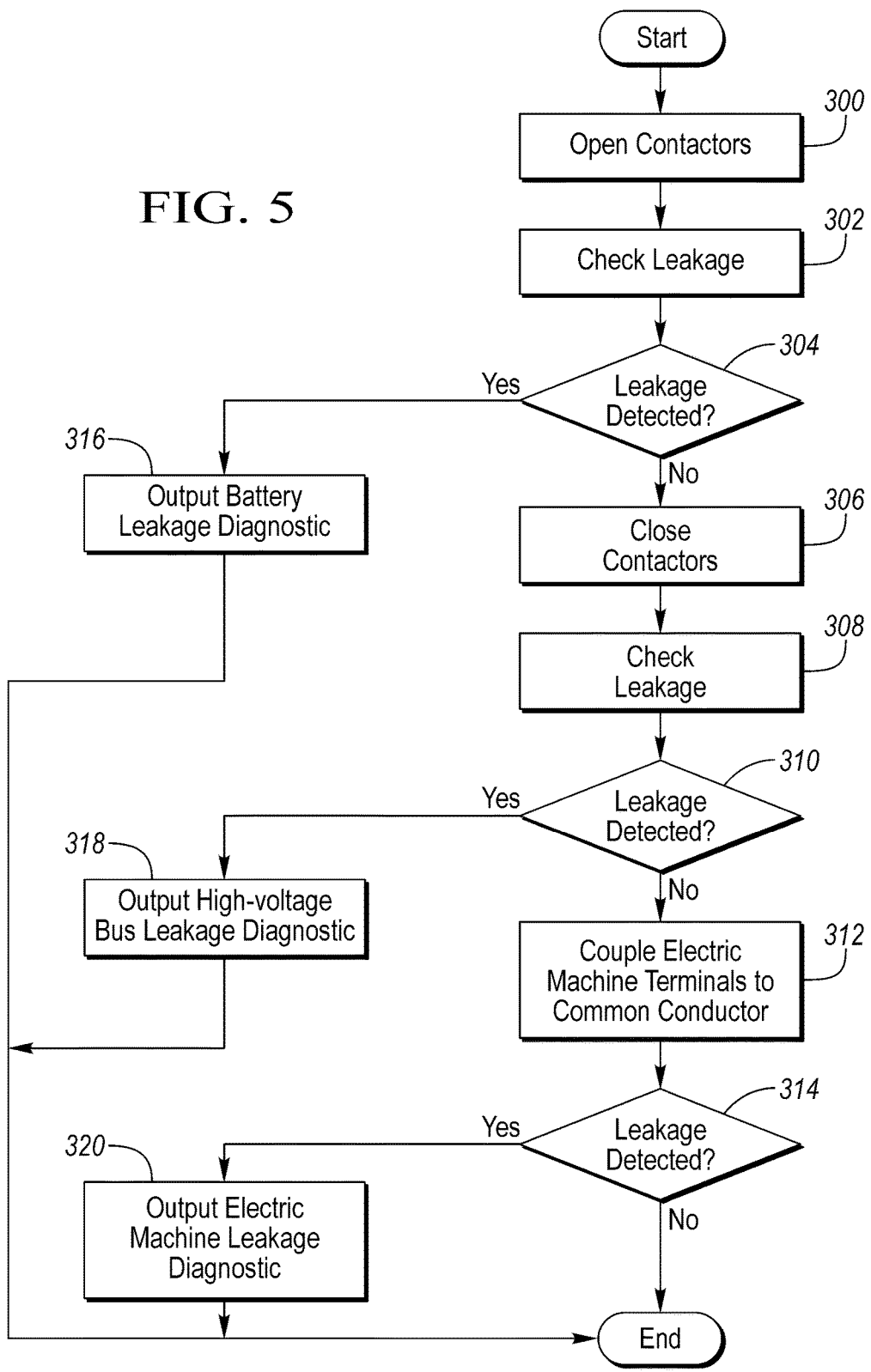
FIG. 5 is a flowchart illustrating possible operations that may be implemented in a controller to detect leakage resistance in a high-voltage system.

FIG. 5 is a flowchart of a possible sequence of operations that may be performed by a controller to isolate the location of an excessive leakage current in a high-voltage system. At operation 300, a sequence of instructions may be executed to open the contactors 42 to isolate the traction battery 24 from the high-voltage bus 130. At operation 302, instructions may be executed to check for leakage by estimating the leakage resistance. At operation 304, instructions may be executed to determine if a leakage condition was detected. A leakage condition may be detected when the estimated leakage resistance is less than a predetermined value. If a leakage condition is detected, operation 316 may be performed. At operation 316, instructions may be executed to output a battery leakage diagnostic. The diagnostic may include alerting the operator via a lamp or sound. The diagnostic may include storage of a diagnostic code in non-volatile memory.

If no leakage is detected at operation 304, instruction may be executed at operation 306 to close the contactors 42 to connect the traction battery 24 to the high-voltage bus 130. At operation 308, instructions may be executed to check for leakage by estimating the leakage resistance. At operation 310, instructions may be executed to determine if a leakage condition was detected. If a leakage condition is detected, operation 318 may be performed. At operation 318, instructions may be executed to output a high-voltage bus leakage diagnostic. The diagnostic may include alerting the operator via a lamp or sound. The diagnostic may include storage of a diagnostic code in non-volatile memory.

If not leakage is detected at operation 310, instructions may be executed at operation 312 to couple the electric machine terminals to a common conductor of the high-voltage bus 130. The instructions may command a specified bank of switching devices 132, 134 within the power electronics module 26 to achieve the coupling. At operation 314, instructions may be executed to check for leakage by estimating the leakage resistance. At operation 314, instructions may be executed to determine if a leakage condition was detected. If a leakage condition is detected, operation 320 may be performed. At operation 320, instructions may be executed to output an electric machine leakage diagnostic. The diagnostic may include alerting the operator via a lamp or sound. The diagnostic may include storage of a diagnostic code in non-volatile memory.

If no leakage is detected at operation 314, the leakage detection process may be complete. In some implementations, the leakage detection may be repeated at a later time.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle comprising:
   a voltage bus including a positive-side conductor and a negative-side conductor;
   an inverter configured to selectively couple the voltage bus to each phase of a three-phase electric machine;
   a switching element arranged within a circuit including the voltage bus and a chassis of the vehicle; and
   at least one controller programmed to, while the switching element is closed, operate the inverter to simultaneously couple terminals of each phase of the three-phase electric machine to a common conductor of the voltage bus to detect a leakage path to the chassis.

2. The vehicle of claim 1 wherein the circuit includes a voltage measurement resistor electrically connected to the chassis of the vehicle and a current limiting resistor electrically connected to the voltage bus, and wherein the switching element selectively couples the voltage measurement resistor and the current limiting resistor.

3. The vehicle of claim 2 wherein the at least one controller is further programmed to operate the switching element to couple the voltage measurement resistor and the current limiting resistor, and measure a voltage across the voltage measurement resistor to estimate a leakage resistance to the chassis.

4. The vehicle of claim 2 wherein the at least one controller is further programmed to detect the leakage path in response to a leakage resistance associated with the leakage path being less than a predetermined resistance, and wherein the leakage resistance is based on a voltage across the voltage measurement resistor and a voltage of the voltage bus.

5. The vehicle of claim 1 wherein the common conductor of the voltage bus is the positive-side conductor of the voltage bus.

6. The vehicle of claim 1 wherein the common conductor of the voltage bus is the negative-side conductor of the voltage bus.

7. The vehicle of claim 1 wherein the terminals of the electric machine are coupled to the common conductor of the voltage bus for a predetermined amount of time.

8. The vehicle of claim 1 wherein the at least one controller is further programmed to output a diagnostic indicator when a leakage resistance associated with the leakage path to the chassis is less than a predetermined resistance.

9. The vehicle of claim 1 wherein the at least one controller is further programmed to detect the leakage path to the chassis in response to a leakage resistance associated with the leakage path being less than a predetermined resistance.

10. A method comprising:
    decoupling, by a controller, a traction battery from a voltage bus and detecting a first leakage resistance;
    coupling, by the controller, the traction battery to the voltage bus and detecting a second leakage resistance;
    coupling, by the controller, each terminal of a three-phase electric machine simultaneously to a common conductor of the voltage bus that is coupled to the traction battery and detecting a third leakage resistance; and
    outputting, by the controller, an isolation diagnostic signal identifying a location of the leakage based on the first, second, and third leakage resistance.

11. The method of claim 10 further comprising outputting, by the controller, a traction battery isolation diagnostic when the first leakage resistance is less than a predetermined resistance.

12. The method of claim 10 further comprising outputting, by the controller, a voltage bus isolation diagnostic when the second leakage resistance is less than a predetermined resistance and the first leakage resistance is greater than the predetermined resistance.

13. The method of claim 10 further comprising outputting, by the controller, an electric machine isolation diagnostic when the third leakage resistance is less than a predetermined resistance and the first leakage resistance and the second leakage resistance are greater than the predetermined resistance.

14. The method of claim 10 wherein detecting the first leakage resistance, the second leakage resistance, and the third leakage resistance further comprises closing, by the controller, a switching element arranged within a circuit including the voltage bus and a vehicle chassis and measuring a voltage within the circuit.

15. A method comprising:
    closing, by a controller, a switching element to connect a leakage detection circuit between a voltage bus and a vehicle chassis;
    coupling, by the controller, each terminal of a three-phase electric machine simultaneously to a common conductor of the voltage bus when a traction battery is coupled to the voltage bus; and
    measuring, by the controller, a voltage within the leakage detection circuit to estimate a leakage resistance.

16. The method of claim 15 wherein the leakage detection circuit is connected to a conductor of the voltage bus other than the common conductor.

17. The method of claim 15 further comprising outputting, by the controller, an electric machine isolation diagnostic when the leakage resistance is less than a predetermined resistance.

18. The method of claim 15 wherein the voltage is measured across a resistor within the leakage detection circuit.

19. The method of claim 15 further comprising coupling the terminals of the three-phase electric machine to the common conductor of the voltage bus for a predetermined period of time.

20. The method of claim 19 wherein the predetermined period of time is a predetermined number of leakage detection cycles.

* * * * *